(12) United States Patent
Frankowsky

(10) Patent No.: US 6,961,917 B2
(45) Date of Patent: Nov. 1, 2005

(54) METHOD FOR ACTIVATING FUSE UNITS IN ELECTRONIC CIRCUIT DEVICE

(75) Inventor: Gerd Frankowsky, Höhenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 252 days.

(21) Appl. No.: 10/325,100

(22) Filed: Dec. 20, 2002

(65) Prior Publication Data

US 2003/0145303 A1 Jul. 31, 2003

(30) Foreign Application Priority Data

Dec. 28, 2001 (DE) .......................................... 101 64 032

(51) Int. Cl.⁷ .............................................. G06F 17/50
(52) U.S. Cl. .............................................. 716/17; 716/4
(58) Field of Search ........................... 716/1, 4, 16–17; 365/200, 225.8; 438/467

(56) References Cited

U.S. PATENT DOCUMENTS 6,002,620 A * 12/1999 Tran et al. .................. 365/200
6,205,064 B1 * 3/2001 Ooishi ........................ 365/200

FOREIGN PATENT DOCUMENTS

EP 011510 B1 8/1984

* cited by examiner

Primary Examiner—Vuthe Siek
Assistant Examiner—Paul Dinh
(74) Attorney, Agent, or Firm—Welsh & Katz, Ltd.

(57) ABSTRACT

The invention provides a method for activating fuse units (101a–101n) in an electronic circuit device (100) in order to modify a circuit design for the electronic circuit device (100), where an electronic circuit device (100) in which fuse units (101a–101n) can be activated is selected, those fuse units (101a–101n) in the selected electronic circuit device (100) which can be activated in order to modify the circuit design for the electronic circuit device (100) are determined, the fuse units (101a–101n) which can be activated in order to mosdify the circuit design for the electronic circuit device (100) are addressed using fuse addressing units (102a–102n), and an activation state of the fuse units (101a–101n) which can be activated in order to modify the circuit design for the electronic circuit device (100) is stipulated, the fuse units (101a–101n) addressed using the fuse addressing units (102a–102n) being activated using fuse activation units (103a–103n) in line with the stipulated activation state.

5 Claims, 5 Drawing Sheets

METHOD FOR ACTIVATING FUSE UNITS IN ELECTRONIC CIRCUIT DEVICE

The invention relates generally to a method for activating substitute elements in faulty electronic circuit devices, and relates in particular to a method for activating fuse units in an electronic circuit device in order to modify a circuit design for the electronic circuit device.

The present invention is based on the problem that, following production, electronic circuit devices can have faulty cells, for example faulty memory cells, which can impair the operability of the entire electronic circuit device. For this reason, redundant cells (memory cells) are usually provided in electronic circuit devices, said redundant cells being able to be activated following production and testing of the corresponding electronic circuit device.

Redundant cells in the partially faulty electronic circuit device are activated in a conventional manner, for example using laser fuse units (laser fuses) which are activated by burning them in using a laser beam.

Disadvantageously, these burn-in points can no longer be accessed from the outside once the electronic circuit device has been packed into a package. For this reason, electronic fuse units, "electronic fuses" (e-fuses), are often used which can be activated externally by applying activation energy—for example in the form of a high-voltage pulse or a current pulse. Normally, a large number of such electronic fuse units is provided in an electronic circuit device (in a circuit chip), which provides the greatest possible variability for repairing faulty cells.

To eliminate faults using redundant cells in the electronic circuit device, up to 20 000 fuse units need to be addressed per electronic circuit device (per chip), and it is necessary to establish for every single electronic fuse unit whether or not it needs to be activated ("to be burned").

In this context, it will be pointed out that electronic fuse units or simply fuse units are intended to be understood to mean units which can both isolate (electrical fuses) and connect (electrical antifuses) a circuit contact on the electronic circuit device.

This addressing or activation of fuse units on the basis of the prior art is extremely time-consuming, which is a disadvantage. Assuming that an electronic circuit device contains 20 000 fuse units which all need to be addressed sequentially in some way and that the time for programming a single fuse unit is 11 ms (millisecond), the total setting time for the electronic circuit device is approximately 20 s. This has a considerable influence on the total test time and disadvantageously increases the test costs, since it is necessary to use a complex test device in order to address and activate the fuse units.

FIG. 1 shows a known circuit arrangement for activating electronic fuse units 101, where at least one fuse activation unit 103 is supplied with an activation data signal 115 via an activation data input 109 while at least one fuse addressing unit 102 is supplied with an addressing data signal 116 via an addressing data input 108. In this context, the fuse addressing unit 102 determines those fuse units 101 which are at all relevant to the repair of the electronic circuit device, while the fuse activation unit 103 stipulates whether or not the corresponding fuse unit just mentioned needs to be activated ("to be burned"). Since this is a sequential process, i.e. since all the fuse addressing units 102a–102n and all the fuse activation units 103a–103n need to be checked sequentially for every single fuse unit 101 in each case, this process disadvantageously entails a long test time, as mentioned above.

This is because the situation with this conventional, sequential method is that a time of approximately 1 ms (millisecond) needs to be provided for each fuse unit, even if it is not being activated or "burned". However, experience shows that it is only necessary to activate a maximum of 50% of the fuse units 101 provided on an electronic circuit device 100. It would thus be possible to save half of the necessary test time. A further saving is obtained when a product "is running at volume", i.e. when a stable process has been obtained for producing an electronic circuit device, up to 90% of the test time is saved, since only 10% of the fuse units are still required in order to repair faulty cells in the electronic circuit device.

FIG. 2 shows the conditions for activating a fuse unit 101 on the basis of the conventional method. Activation energy 121, which for technological reasons needs to be maintained for a time of at least approximately 1 ms and can be provided in the form of a high-voltage pulse and/or a current pulse, is applied to an activation input 122. As shown schematically in FIG. 2, an activation data signal 115, an addressing data signal 116 and an activation pulse signal 120 are ANDed, so that activation of the fuse unit 101 is provided only when all three signals 115, 116 and 120 are present.

Since a clock signal of fixed frequency is prescribed, the procedure shown in FIG. 2, based on the conventional method, disadvantageously does not allow a reduction in test time.

As FIG. 3(a) shows, fuse data 117 are supplied continually on the basis of a clock signal 110, where a clock signal period duration 118 is 50 ns (nanoseconds), for example. As FIG. 3(b) shows, the fuse addressing unit 102 uses the addressing data signal 116 to address only the fuse units which are to be activated. In addition, an activation data signal 115 is shown which has an activation time 119, typically 1 ms.

It is thus a drawback of conventional methods for activating fuse units that every single fuse unit relevant to the repair of cells in the electronic circuit device 100 needs to be addressed, which means that a long test time results.

Two shift operations are necessary in order to activate fuse units. First, the fuse data need to be shifted into the fuse activation units, which can take place at low frequencies (10–20 MHz). In addition, the fuse units are addressed sequentially in order to reduce the current which is to be provided at the input of the electronic circuit device for the purpose of activating fuse units. The fuse addressing unit sets an addressing pointer to an individual fuse unit, and the pointer is then set to the next fuse unit.

The following three conditions need to be satisfied in order to activate a fuse, as already explained with reference to FIG. 2:

(i) the fuse activation unit contains a value which makes it necessary to activate the fuse unit;
(ii) the fuse unit is chosen by the addressing pointer in the fuse addressing unit; and
(iii) an activation pulse signal is ready to connect the fuse unit which is to be activated to a high-voltage/high-current source.

This method has, as already mentioned, the drawback that it takes a long time.

It is thus an object of the present invention to provide a method for activating fuse units in electronic circuit devices in which it is possible to modify a circuit design for the electronic circuit device and in which fuse unit [sic] which do not need to be activated are not addressed by a fuse addressing unit.

A fundamental concept of the invention involves the use of logic units which couple at least one fuse addressing unit and at least one fuse activation unit, so that cooperation between fuse addressing units and fuse activation units makes it possible to prevent an address pointer in the fuse addressing unit from pointing to fuse units which do not need to be activated in order to modify a circuit design for the electronic circuit device.

It is thus an advantage of the present invention that fuse units which do not need to be activated are not addressed, which results in a time saving of from 50% to 90%.

Another advantage of the present invention is that inexpensive activation of fuse units in order to modify a circuit design for electronic circuit devices can be achieved.

The inventive method for activating fuse units in an electronic circuit device essentially has the following steps:
a) an electronic circuit device in which fuse units can be activated is selected in order to be advantageously able to activate substitute cell elements which are redundant and can replace faulty cell elements in the electronic circuit device;
b) those fuse units in the selected electronic circuit device which can be activated in order to modify the circuit design for the electronic circuit device are determined such that faulty cells in the electronic circuit device can be repaired;
c) the fuse units which can be activated in order to modify the circuit design for the electronic circuit device are addressed using fuse addressing units;
d) an activation state of the fuse units which can be activated in order to modify the circuit design for the electronic circuit device is stipulated; and
e) the fuse units addressed using the fuse addressing units are activated using fuse activation units in line with the stipulated activation state.

The subclaims contain advantageous developments and improvements of the respective subject matter of the invention.

In line with one preferred development of the present invention, the fuse addressing units increment a counter by one if an activation state of the fuse units which can be activated in order to modify the circuit design for the electronic circuit device cannot be altered by the fuse activation units, i.e. if a fuse unit cannot "be burned".

In line with another preferred development of the present invention, the fuse addressing units and the fuse activation units are coupled by means of logic units such that the address pointer in a fuse addressing unit points only to fuse activation units which need to be activated, which advantageously results in a considerable reduction in the total activation time for all the fuse units arranged on the electronic circuit device.

In line with yet another preferred development of the present invention, at least one of the logic units bridges a corresponding fuse addressing unit using a bridging unit if a fuse unit addressed using the fuse addressing unit cannot be activated using the corresponding fuse activation unit, i.e. if the corresponding fuse unit cannot "be burned".

In line with yet another preferred development of the present invention, a fuse addressing unit is bridged by switching the corresponding fuse addressing unit to a transparent mode.

In line with yet another preferred development of the present invention, a fuse addressing unit is bridged by switching two changeover units which advantageously isolate the inputs and outputs of the corresponding fuse addressing unit from the remaining fuse addressing units, the fuse addressing unit to be bridged being bridged at the same time using a line connection.

The inventive apparatus for activating fuse units in an electronic circuit device in order to modify a circuit design for the electronic circuit device also has:
a) at least one fuse unit which can be activated in the electronic circuit device;
b) at least one fuse addressing unit for addressing the fuse units which can be activated in order to modify the circuit design for the electronic circuit device;
c) at least one fuse activation unit for activating the fuse units addressed using the at least one fuse addressing unit; and
d) at least one logic unit for logically combining the at least one fuse addressing unit with the at least one fuse activation unit such that the total activation time for the fuse units in the electronic circuit device is reduced.

Exemplary embodiments of the invention are shown in the drawings and are explained in more detail in the description below.

In the drawings.

In the figures, identical reference symbols denote components or steps which are identical or have identical functions.

Figure 4:
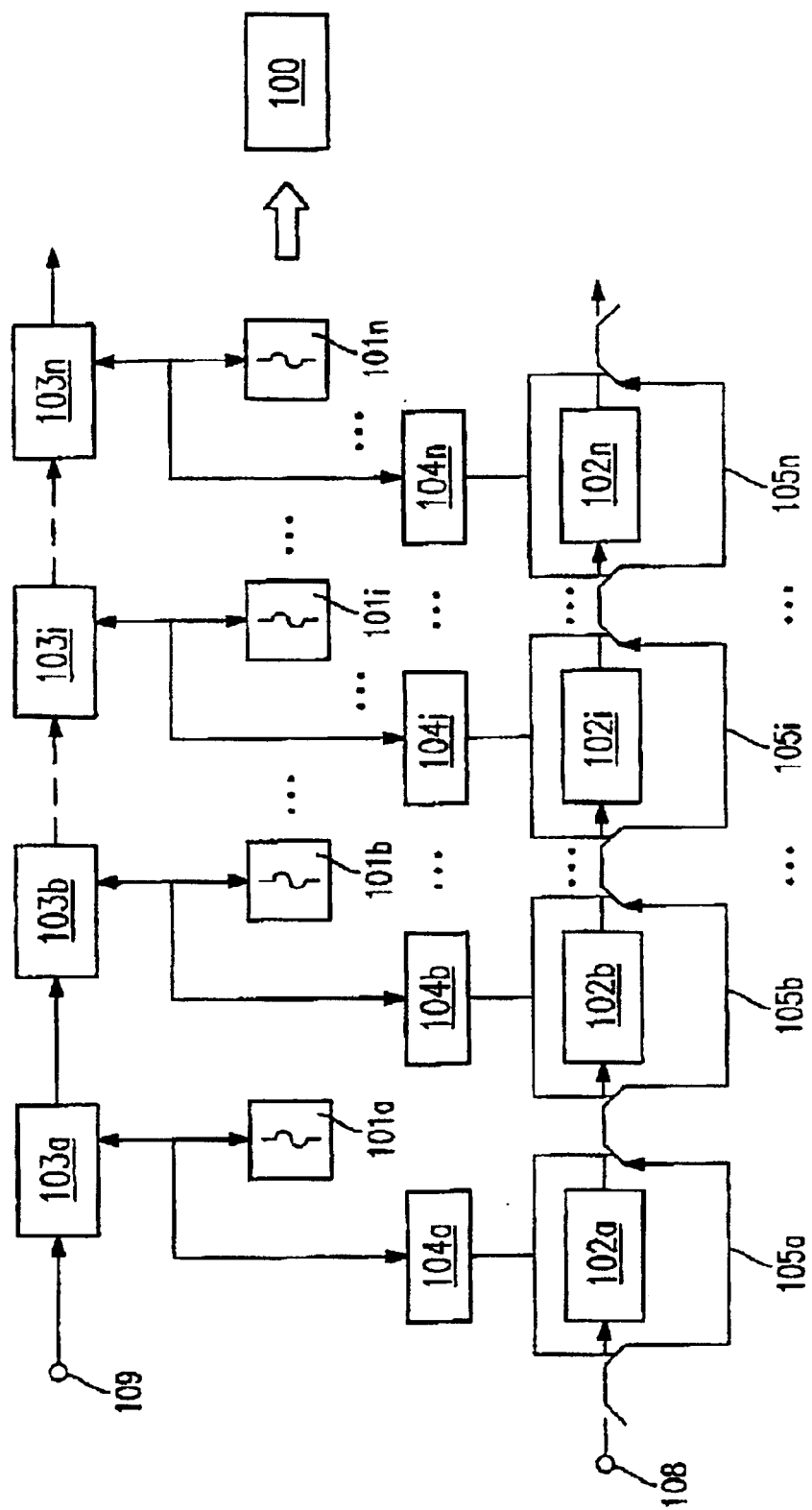
FIG. 4 shows an arrangement for activating fuse units in line with an exemplary embodiment of the present invention.

In the arrangement shown in FIG. 4 for activating fuse units $101a$, $101b$, ... $101i$, ... $101n$, where i is a sequential index, a number of fuse addressing units $102a$–$102n$ which corresponds to a number of fuse units $101a$–$101n$ and a corresponding number of fuse activation units $103$–$103n$ are provided. FIG. 4 also shows logic units $104a$–$104n$ which perform a logic function between the fuse addressing unit $102a$–$102n$ and a corresponding fuse activation unit $103a$–$103n$.

The arrangement shown in FIG. 4 for addressing and activating fuse units $101a$–$101n$ has fuse addressing units $102a$–$102n$, on the one hand, and fuse activation units $103a$–$103n$, on the other. This structure for activating (also referred to as "programming") fuse units $101a$–$101n$ is necessary since, when faulty cells (memory cells) appear in an electronic circuit device $100$, only some of the fuse units $101a$–$101n$ can be used for repair or for activation of substitute elements.

In addition, only some of the activatable fuse units $101a$–$101n$ need to be activated in order to substitute a substitute element for a faulty cell in the electronic circuit device $100$. Hence, the fuse addressing units $102a$–$102n$ serve to stipulate those fuse units $101a$–$101n$ in the electronic circuit device $100$ which are at all relevant to substitution or to repair of faulty cells in the electronic circuit device $100$. The fuse units $101a$–$101n$ which are relevant to repair of the electronic circuit device $100$—or the electronic memory chip—are addressed by the fuse addressing units $102a$–$102n$, with the information stored in the corresponding fuse activation units $103a$–$103n$ deciding whether or not the respective fuse unit $101a$–$101n$ addressed by the fuse addressing unit $102a$–$102n$ needs to be activated ("to be burned").

For technological reasons, a particular activation time 119 (described with reference to FIG. 3) is necessary in order "to burn" or to activate an electronic fuse unit 101a–101n reliably.

The exemplary embodiment of the present invention which is currently being described now achieves a considerable time saving by virtue of not every fuse unit 101a–101n passing through an addressing/activation cycle, which is extremely laborious on account of the relatively long activation time 119. In accordance with the invention, only those fuse units 101a–101n which actually need to be activated by a fuse activation unit 103a–103n are now addressed. This allows a considerable reduction in activation time for the fuse units 101a–101n contained in the electronic circuit device 100.

With a clock signal period duration 118 (described with reference to FIG. 3) of 50 ns, for example, which corresponds to a clock frequency of 20 MHz, reading in fuse data 117 (described with reference to FIG. 3) requires a time which, for a typical number of fuse units 101a–101n of 20 000 (typical number of fuse units in an electronic circuit device or in an electronic memory chip), is calculated as:

20 000 fuse units*50 ns=1 ms (total read-in time).

A fundamental advantage of the inventive method is that now not every single fuse unit 101a–101n which is relevant to repair of faulty memory cells is addressed and a possible activation time 119 of 1 ms waited, but rather only those fuse units 101a–101n which, as prescribed by the fuse activation units 101a–101n, actually need to be activated are addressed. Fault analyses for manufacturing processes for electronic circuit devices 100 have shown that, on statistical average, only 50% of the fuse units 101a–101n contained in the electronic circuit device 100 need to be activated. This percentage can fall to 10% for processes running "at volume", i.e. for processes which are stable. It is thus clear that a considerable total activation time can be saved.

To this end, logic units 104a–104n have additionally been introduced into the arrangement shown in FIG. 4, as already mentioned. These logic units directly link corresponding fuse addressing units to associated fuse activation units. In particular, the logic units 104a–104n ensure that, if a fuse activation unit 103a–103n indicates that a corresponding fuse unit 101a–101n does not need to be activated, the address pointer in the corresponding fuse addressing unit 102a–102n skips the corresponding fuse unit 101a–101n and immediately passes to the next, relevant fuse unit 101a–101n.

Figure 5:
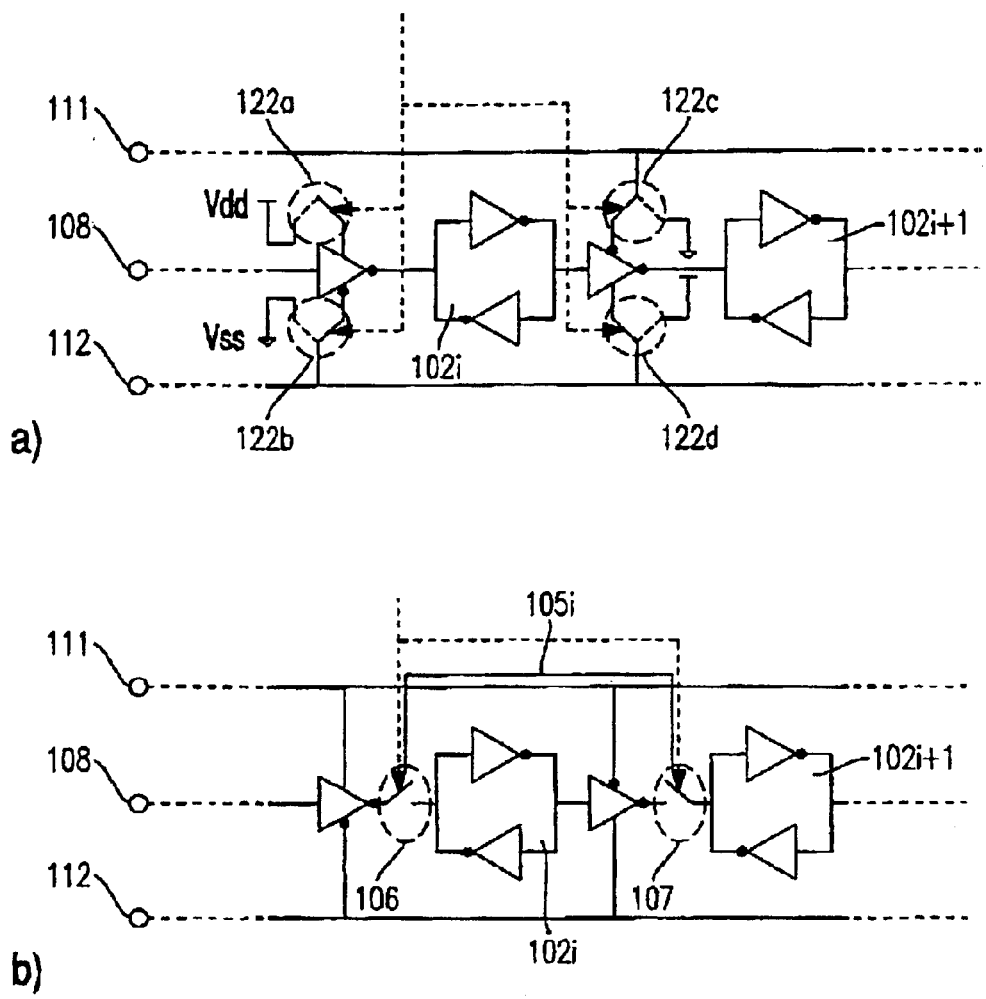
FIG. 5 shows, by way of example, two circuit arrangements for bridging one or more fuse addressing units in line with an exemplary embodiment of the present invention.

The fuse addressing units 102a–102n can each be in the form of shift registers, in the same way as the fuse activation units 103a–103n. The corresponding fuse addressing unit 102a–102n is bridged, as indicated in FIG. 4, using a corresponding bridging unit 105a–105n. The way in which the corresponding bridging unit 105a–105n works is explained in more detail below with reference to FIG. 5.

FIG. 5(a) shows a first exemplary embodiment of the present invention for bridging fuse addressing units 102a–102n, shown on a fuse addressing unit 102i. An addressing data signal 116 is applied to an addressing data input 108, while appropriate clock signals are applied to a first addressing data clock input and to a second addressing data clock input 111 and 112. It will now be assumed that a fuse unit 101i associated with the fuse addressing unit 102i does not need to be activated. In this case, as already mentioned, the fuse addressing unit 102i needs to be skipped. In FIG. 5(a) this is achieved by virtue of the fuse addressing unit 102i being switched to a "transparent" mode. In this context, the information from the fuse activation unit (activation or not) 103a–103n is supplied to an electronic switching device (indicated by dotted lines). The changeover units 122a–122d shown in FIG. 5(a) are changed over by virtue of the addressing data signal applied to the addressing data input 108 being forwarded directly to the next fuse addressing unit, in this case referred to as fuse unit 102i+1, upon the next pulse of the clock signal.

Another example of bridging a corresponding fuse addressing unit 102i is shown in FIG. 5(b). In this case, there is no "transparent" switching of the corresponding fuse activation unit 102i, as described above with reference to FIG. 5(a), but rather only simple bridging using the bridging unit 105i already mentioned with reference to FIG. 4. This bridging unit 105i, for example a simple line bridge, is created using a first changeover unit 106 and a second changeover unit 107, the inputs and outputs of the fuse addressing unit 102i being decoupled from the rest of the circuit components, as shown in FIG. 5(b).

The inventive method for activating fuse units thus affords considerable economic advantages since, as already mentioned, only those fuse units which actually need to be activated are addressed. If it is assumed that, by way of example, only 10% of the fuse units which are actually relevant to the repair of memory cells need to be activated, then the total activation time for a typical number of 20 000 fuse units is reduced from:

20 000 fuse units*1 ms=20 s to a total activation time of 2 000 fuse units*1 ms=2 s.

Figure 1:
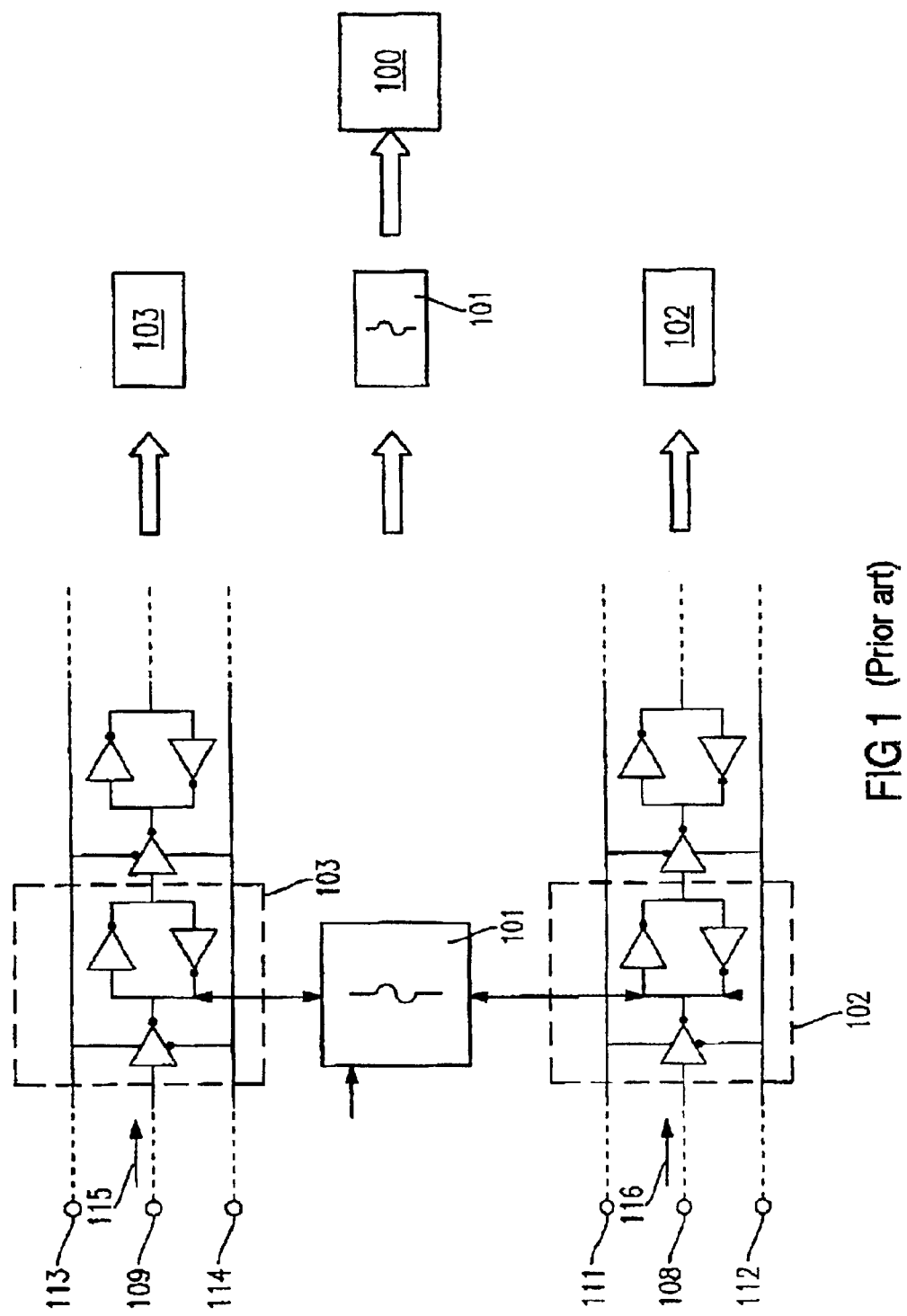
FIG. 1 shows a conventional arrangement for activating fuse units contained in an electronic circuit device.
Figure 2:
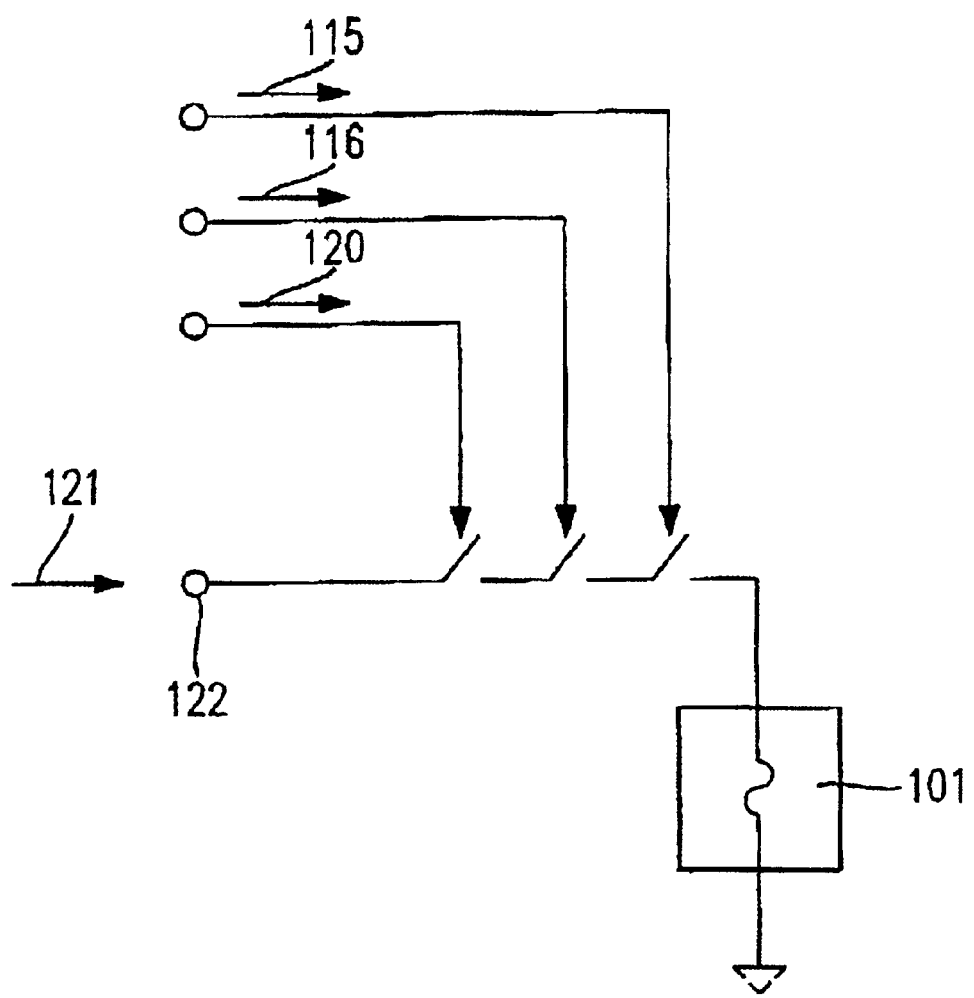
FIG. 2 shows a schematic illustration of the conditions for activating a fuse unit on the basis of a method based on the prior art.
Figure 3:
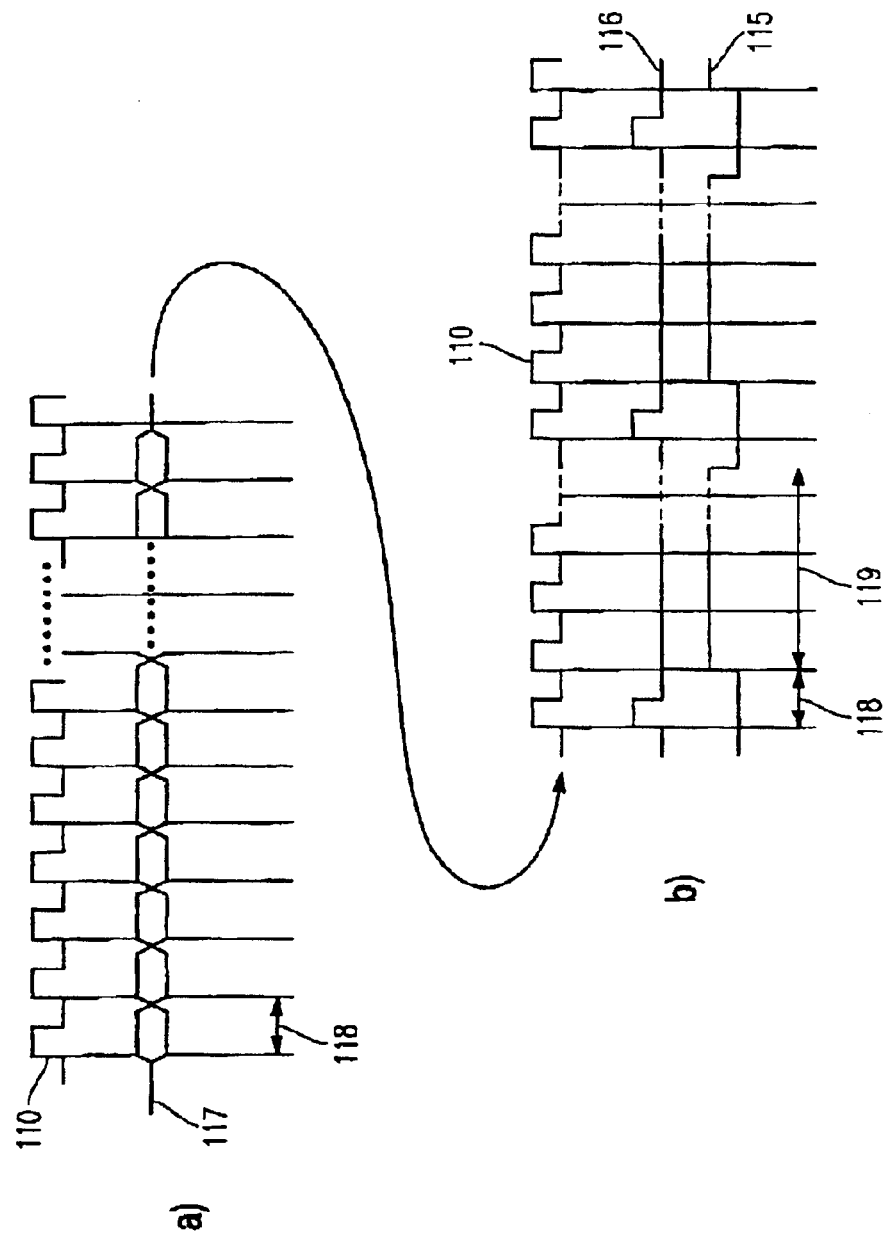
FIG. 3 shows an example of a conventional programming sequence for electronic fuse units.

With regard to the conventional arrangements and methods for activating fuse units in electronic circuit devices which are shown in FIGS. 1 to 3, reference is made to the introduction to the description.

Although the present invention has been described above with reference to preferred exemplary embodiments, it is not limited thereto, but rather can be modified in a variety of ways.

List of Reference Symbols

In the figures, identical reference symbols denote components or steps which are identical or have identical functions.

100 Electronic circuit device
101, Fuse unit
101a–101n
102, Fuse addressing unit
102a–102n
103, Fuse activation unit
103a–103n
104a–104n Logic unit
105a–105n Bridging unit
106 First changeover unit
107 Second changeover unit
108 Addressing data input
109 Activation data input
110 Clock signal
111 First addressing data clock input
112 Second addressing data clock input
113 First activation data clock input
114 Second activation data clock input
115 Activation data signal
116 Addressing data signal
117 Fuse data
118 Clock signal period duration 119 Activation time
120 Activation pulse signal
121 Activation energy
122a–122d Changeover units

What is claimed is:

1. Method for activating fuse units in an electronic circuit device in order to modify a circuit design for the electronic circuit device, in which fuse addressing units and fuse activation units cooperate, having the following steps:
   a) an electronic circuit device in which fuse units are to be activated is selected;
   b) those fuse units in the selected electronic circuit device which are to be activated in order to modify the circuit design for the electronic circuit device are determined;
   c) the fuse units are sequentially addressed using fuse addressing units;
   d) an activation state of the fuse units is stipulated;
   e) the fuse units addressed using the fuse addressing units are activated using the fuse activation units in line with the stipulated activation state; and
   f) the fuse addressing units skip immediately to an addressed fuse unit not to be activated using said fuse activation units by addressing a next one of the fuse units.

2. Method according to claim 1, wherein the fuse addressing units and the fuse activation units are coupled by means of logic units.

3. Method according to claim 2, wherein at least one logic unit bridges a corresponding fuse addressing unit using a bridging unit if a fuse unit addressed using the fuse addressing unit is not to be activated using the corresponding fuse activation unit.

4. Method according to claim 2, wherein a fuse addressing unit is bridged by switching the corresponding fuse addressing unit to a transparent mode.

5. Method according to claim 1, wherein a fuse addressing unit is bridged by virtue of two changeover units bridging the inputs and outputs of the corresponding fuse addressing unit using a bridging unit and isolating them from the remaining fuse addressing units.

* * * * *